(12) United States Patent
Manna et al.

(10) Patent No.: US 11,488,856 B2
(45) Date of Patent: Nov. 1, 2022

(54) METHODS FOR GAPFILL IN HIGH ASPECT RATIO STRUCTURES

(71) Applicant: Applied Materials, Inc., Santa Clara, CA (US)

(72) Inventors: Pramit Manna, Sunnyvale, CA (US); Ludovic Godet, Sunnyvale, CA (US); Rui Cheng, Santa Clara, CA (US); Erica Chen, Cupertino, CA (US); Ziqing Duan, San Jose, CA (US); Abhijit Basu Mallick, Palo Alto, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/069,195

(22) Filed: Oct. 13, 2020

(65) Prior Publication Data
US 2021/0028055 A1 Jan. 28, 2021

Related U.S. Application Data

(62) Division of application No. 16/259,175, filed on Jan. 28, 2019, now Pat. No. 10,811,303, which is a (Continued)

(51) Int. Cl.
*H01L 21/762* (2006.01)
*H01L 21/768* (2006.01)
(Continued)

(52) U.S. Cl.
CPC .. *H01L 21/76224* (2013.01); *H01L 21/02123* (2013.01); *H01L 21/76283* (2013.01);
(Continued)

(58) Field of Classification Search
CPC ......... H01L 21/76224; H01L 21/76227; H01L 21/76837; H01L 21/76838;
(Continued)

(56) References Cited

U.S. PATENT DOCUMENTS

| 5,726,094 A | 3/1998 | Schwalke et al. |
| 5,805,973 A | 9/1998 | Coffinberry et al. |

(Continued)

FOREIGN PATENT DOCUMENTS

| KR | 20010008586 A | 2/2001 |
| KR | 20090013286 A | 2/2009 |

(Continued)

OTHER PUBLICATIONS

PCT International Preliminary Report on Patentability in PCT/US2017/022905 dated Sep. 27, 2018, 6 pages.
(Continued)

*Primary Examiner* — Thanhha S Pham
(74) *Attorney, Agent, or Firm* — Servilla Whitney LLC

(57) ABSTRACT

Methods for seam-less gapfill comprising sequentially depositing a film with a seam, reducing the height of the film to remove the seam and repeating until a seam-less film is formed. Some embodiments include optional film doping and film treatment (e.g., ion implantation and annealing).

15 Claims, 4 Drawing Sheets

Related U.S. Application Data division of application No. 15/461,847, filed on Mar. 17, 2017, now Pat. No. 10,192,775.

(60) Provisional application No. 62/334,132, filed on May 10, 2016, provisional application No. 62/309,706, filed on Mar. 17, 2016.

(51) Int. Cl.
  *H01L 21/02* (2006.01)
  *H01L 23/31* (2006.01)
  *H01L 29/06* (2006.01)

(52) U.S. Cl.
  CPC .. *H01L 21/76286* (2013.01); *H01L 21/76837* (2013.01); *H01L 23/3178* (2013.01); *H01L 29/0649* (2013.01)

(58) Field of Classification Search
  CPC ......... H01L 21/76847; H01L 21/76859; H01L 21/76862
  See application file for complete search history.

(56) References Cited

U.S. PATENT DOCUMENTS

| | | | |
|---|---|---|---|
| 6,077,643 A | 6/2000 | Kumar et al. |
| 6,149,974 A | 11/2000 | Nguyen et al. |
| 6,149,987 A | 11/2000 | Perng et al. |
| 6,200,893 B1 | 3/2001 | Sneh |
| 6,319,324 B1 | 11/2001 | Nguyen et al. |
| 6,352,755 B1 | 3/2002 | Finley et al. |
| 6,492,694 B2 | 12/2002 | Noble et al. |
| 6,642,092 B1 | 11/2003 | Voutsas et al. |
| 6,730,584 B2 | 5/2004 | Schuegraf et al. |
| 6,759,081 B2 | 7/2004 | Huganen et al. |
| 6,849,471 B2 | 2/2005 | Patel et al. |
| 6,867,152 B1 | 3/2005 | Hausmann et al. |
| 7,208,354 B2 | 4/2007 | Bauer |
| 7,335,609 B2 | 2/2008 | Ingle et al. |
| 7,541,297 B2 | 6/2009 | Mallick et al. |
| 7,544,576 B2 | 6/2009 | Jawarani et al. |
| 7,625,820 B1 | 12/2009 | Papasouliotis et al. |
| 7,630,114 B2 | 12/2009 | Wang et al. |
| 7,910,491 B2 | 3/2011 | Kwon et al. |
| 8,129,290 B2 | 3/2012 | Balseanu et al. |
| 8,338,225 B2 | 12/2012 | Breitwisch et al. |
| 8,557,712 B1 | 10/2013 | Antonelli et al. |
| 8,575,753 B2 | 11/2013 | Choi et al. |
| 8,697,533 B2 | 4/2014 | Herner |
| 8,728,955 B2 | 5/2014 | Lavoie et al. |
| 8,728,958 B2 | 5/2014 | Ashtiani et al. |
| 8,753,989 B2 | 6/2014 | Balseanu et al. |
| 8,883,603 B1 | 11/2014 | Maxwell |
| 9,087,878 B2 | 7/2015 | Yu et al. |
| 9,355,886 B2 | 5/2016 | Swaminathan et al. |
| 2002/0086110 A1 | 7/2002 | Vercammen et al. |
| 2003/0083189 A1 | 5/2003 | Yamamoto et al. |
| 2003/0155074 A1 | 8/2003 | Yao |
| 2005/0208760 A1 | 9/2005 | Ryan |
| 2006/0199399 A1 | 9/2006 | Muscat |
| 2006/0202311 A1 | 9/2006 | Nguyen et al. |
| 2007/0037360 A1 | 2/2007 | Jeong |
| 2007/0117359 A1 | 5/2007 | Todd |
| 2008/0124925 A1 | 5/2008 | Madan et al. |
| 2008/0138985 A1 | 6/2008 | Madan et al. |
| 2008/0217775 A1 | 9/2008 | Pai |
| 2008/0254619 A1 | 10/2008 | Lin et al. |
| 2008/0311711 A1 | 12/2008 | Hampp et al. |
| 2009/0035941 A1 | 2/2009 | Park et al. |
| 2009/0075454 A1 | 3/2009 | Ang |
| 2009/0079013 A1 | 3/2009 | Kim |
| 2009/0098706 A1 | 4/2009 | Kim et al. |
| 2009/0246974 A1 | 10/2009 | Clark |
| 2011/0034039 A1 | 2/2011 | Liang et al. |
| 2011/0097902 A1 | 4/2011 | Singh et al. |
| 2011/0159213 A1 | 6/2011 | Cai et al. |
| 2011/0198736 A1 | 8/2011 | Shero et al. |
| 2012/0009802 A1 | 1/2012 | Lavoie et al. |
| 2012/0012170 A1 | 1/2012 | Foss et al. |
| 2012/0196451 A1 | 8/2012 | Mallick |
| 2012/0213940 A1 | 8/2012 | Mallick |
| 2012/0235273 A1* | 9/2012 | Chen ................. H01L 21/76224 257/E29.02 |
| 2012/0244701 A1 | 9/2012 | Higuchi et al. |
| 2013/0084700 A1 | 4/2013 | Swerts et al. |
| 2013/0171822 A1 | 7/2013 | Chandrashekar et al. |
| 2013/0196078 A1 | 8/2013 | Yudovsky et al. |
| 2014/0011354 A1 | 1/2014 | Lei et al. |
| 2014/0045342 A1 | 2/2014 | Mallick et al. |
| 2014/0068962 A1 | 3/2014 | Mori et al. |
| 2014/0159145 A1 | 6/2014 | Park |
| 2014/0252620 A1 | 9/2014 | Huang et al. |
| 2014/0273529 A1 | 9/2014 | Nguyen et al. |
| 2014/0349478 A1 | 11/2014 | Koschinsky et al. |
| 2015/0017794 A1 | 1/2015 | Takamure et al. |
| 2015/0044442 A1 | 2/2015 | Huang et al. |
| 2015/0147824 A1 | 5/2015 | Cameron et al. |
| 2015/0162214 A1 | 6/2015 | Thompson et al. |
| 2015/0170961 A1 | 6/2015 | Romero et al. |
| 2015/0243545 A1 | 8/2015 | Tang et al. |
| 2015/0299848 A1 | 10/2015 | Haukka et al. |
| 2016/0056077 A1 | 2/2016 | Lai et al. |
| 2016/0093528 A1 | 3/2016 | Chandrashekar et al. |
| 2016/0148800 A1 | 5/2016 | Henri et al. |
| 2016/0222504 A1 | 8/2016 | Haukka et al. |

FOREIGN PATENT DOCUMENTS

| | | |
|---|---|---|
| KR | 100913331 B1 | 8/2009 |
| KR | 101349993 B1 | 1/2014 |
| KR | 101426483 B1 | 8/2014 |
| WO | 2009/082517 A1 | 7/2009 |

OTHER PUBLICATIONS

PCT International Search Report and Written Opinion in PCT/US2017/022905 dated Jun. 27, 2017, 9 pages.

Bitto, Florian, et al., "Chlorosilanes and 3,5-Dimethylpyrazole: Multinuclear Complexes, Acetonitrile Insertion and 29Si NMR Chemical-Shift Anisotropy Studies", Eur. J. Inorg. Chem. 2013, 2954-2962.

Hashemi, Fatemeh Sadat Minaye, et al., "Self-Correcting Process for High Quality Patterning by Atomic Layer Deposition", American Chemical Society, 2015, vol. 9, No. 9, pp. 8710-8717.

Hashemi, Fatemeh Sadat Minaye, et al., "Sequential Regeneration of Self-Assembled Monolayers for Highly Selective Atomic Layer Deposition", Advanced Materials Interfaces, 2016, 7 pages.

Kalanyan, Berc, et al., "Using Hydrogen to Expand the Inherent Substrate Selectivity Window During Tungsten Atomic Layer Deposition", American Chemical Society, Chem. Mater. 2016, 28, pp. 117-126.

Kim, Honggun, et al., "Novel Flowable CVD Process Technology for sub-20nm Interlayer Dielectrics", Process Development Team, Semiconductor R&D Center, Thin Film Team, Manufacturing Center, Samsung Electronics Co., LTD., 2012, 3 pages.

Lee, Younghee, et al., "Atomic Layer Deposition of AlF3 Using Trimethylaluminum and Hydrogen Fluoride", The Journal of Physical Chemistry C., 2015, 119 (25), pp. 14185-14194.

Mahé, Olivier, et al., "Deoxofluorination Reactions Using N,N-Disubstituted Aminodifluorosulfinium Tetrafluoroborate Salts", Journal of Fluorine Chemistry 153 (2013) 57-60.

Selvaraj, Sathees Kannan, et al., "Selective atomic layer deposition of zirconia on copper patterned silicon substrates using ethanol as oxygen source as well as copper reductant", Journal of Vacuum Science & Technology A, 32(1), Jan./Feb. 2014, 5 pages.

Smith, Catherine J., et al., "Palladium catalysed aryl amination reactions in supercritical carbon dioxide", Org. Biomol. Chem., 2005, 3, 3767-3781.

(56) References Cited

OTHER PUBLICATIONS

Tao, Qian, et al., "On the initial growth of atomic layer deposited TiO2 films on silicon and copper surfaces", Thin Solid Films 520 (2012), pp. 6752-6756.

Tao, Qian, et al., "Selective Atomic Layer Deposition of HfO 2 on Copper Patterned Silicon Substrates", Applied Physics Letters 96, 192105 (2010), 4 pages.

Tarre, Aivar, et al., "Atomic layer deposition of Cr2O3 thin films: Effect of crystallization on growth and properties", Applied Surface Science 254 (2008), pp. 5149-5156.

Wang, Guilei, et al., "Application of Atomic Layer Deposition Tungsten (ALD W) as Gate Filling Metal for 22 nm and Beyond Nodes CMOS Technology", ECS Journal of Solid State Science and Technology, 3 (4) P82-P85 (2014).

Yan, Yan, et al., "Flowable CVD Process Application for Gap Fill at Advanced Technology", ECS Transactions, 60 (1) 503-506 (2014).

\* cited by examiner

METHODS FOR GAPFILL IN HIGH ASPECT RATIO STRUCTURES

CROSS-REFERENCE TO RELATED APPLICATIONS

This application is a divisional application of U.S. application Ser. No. 16/259,175, filed on Jan. 28, 2019, which is a divisional application of U.S. application Ser. No. 15/461,847, filed on Mar. 17, 2017, which claims priority to U.S. Provisional Application No. 62/309,706, filed Mar. 17, 2016, and U.S. Provisional Application No. 62/334,132, filed May 10, 2016, the entire disclosures of which are hereby incorporated by reference herein.

TECHNICAL FIELD

The present disclosure relates generally to methods of depositing thin films. In particular, the disclosure relates to processes for filling narrow trenches.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. One method that has had past success is flowable CVD. In this method, oligomers are carefully formed in the gas phase which condense on the surface and then "flow" into the trenches. The as-deposited film is of very poor quality and requires processing steps such as steam anneals and UV-cures.

As the dimensions of the structures decrease and the aspect ratios increase post curing methods of the as deposited flowable films become difficult. Resulting in films with varying composition throughout the filled trench.

Amorphous silicon has been widely used in semiconductor fabrication processes as a sacrificial layer since it can provide good etch selectivity with respect to other films (e.g., silicon oxide, amorphous carbon, etc.). With decreasing critical dimensions (CD) in semiconductor fabrication, filling high aspect ratio gaps becomes increasingly sensitive for advanced wafer fabrication. Current metal replacement gate processes involve a furnace poly-silicon or amorphous silicon dummy gate. A seam forms in the middle of the Si dummy gate due to the nature of process. This seam may be opened up during the post process and cause structure failure.

Conventional plasma-enhanced chemical vapor deposition (PECVD) of amorphous silicon (a-Si) forms a "mushroom shape" film on top of the narrow trenches. This is due to the inability of the plasma to penetrate into the deep trenches. The results in pinching-off the narrow trench from the top; forming a void at the bottom of the trench.

Conventional thermal CVD/furnace processes can grow a-Si via thermal decomposition of a silicon precursor (e.g., silane). However, due to the inadequate precursor supply or presence of decomposition byproduct, the deposition rate is higher on top of trenches comparing with it at the bottom. A narrow seam or void can be observed in the trench.

Therefore, there is a need for methods for gapfill in high aspect ratio structures that can provide seam-free film growth.

SUMMARY

One or more embodiments of the disclosure are directed to processing methods comprising providing a substrate surface having at least one feature thereon. The at least one feature extends a depth from the substrate surface to a bottom surface. The at least one feature has a width defined by a first sidewall and a second sidewall. A film is formed on the substrate surface and the first sidewall, second sidewall and bottom surface of the at least one feature. The film has a seam located within the width of the feature at a first distance from the bottom surface of the feature. The height of the film is reduced to less than the first distance to remove at least some of the film and the seam.

Further embodiments of the disclosure are directed to processing methods comprising positioning a substrate surface in a processing chamber. The substrate surface has at least one feature thereon. The at least one feature extends a depth from the substrate surface to a bottom surface and has a first sidewall and a second sidewall defining a width. The at least one feature is filled comprising sequentially exposing the substrate surface to a film deposition process and an etch process. The film deposition process comprises forming a conformal film on the at least one feature creating a seam within the width of the feature. The seam has a bottom edge that is a first distance from the bottom surface of the feature. The etch process decreases the height of the conformal film to an amount less than the first distance to remove the seam. Each successive film deposition forms a seam within the width of the feature. Each successive seam has a bottom edge a distance from the bottom surface of the feature that is greater than the previous distance.

Further embodiments of the disclosure are directed to processing methods comprising providing a substrate surface having at least one feature. The least one feature extends a depth from the substrate surface to a bottom surface. The at least one feature has a first sidewall and a second sidewall defining a width. The at least one feature is filled with an amorphous silicon film by a gapfill process. The gapfill process comprises sequentially depositing an amorphous silicon film with a seam, etching the amorphous silicon film to remove the seam and annealing the amorphous silicon. Each deposition of the amorphous film forms the seam a greater distance from the bottom surface of the feature than a previous deposition. The gapfill process is repeated until an amorphous silicon film is deposited without a seam.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure provide methods of depositing a film (e.g., amorphous silicon) in high aspect ratio (AR) structures with small dimensions. Some embodiments advantageously provide methods involving cyclic deposition-etch-treatment processes that can be performed in a cluster tool environment. Some embodiments advantageously provide seam-free doped or alloyed high quality amorphous silicon films to fill up high AR trenches with small dimensions.

Figure 1:
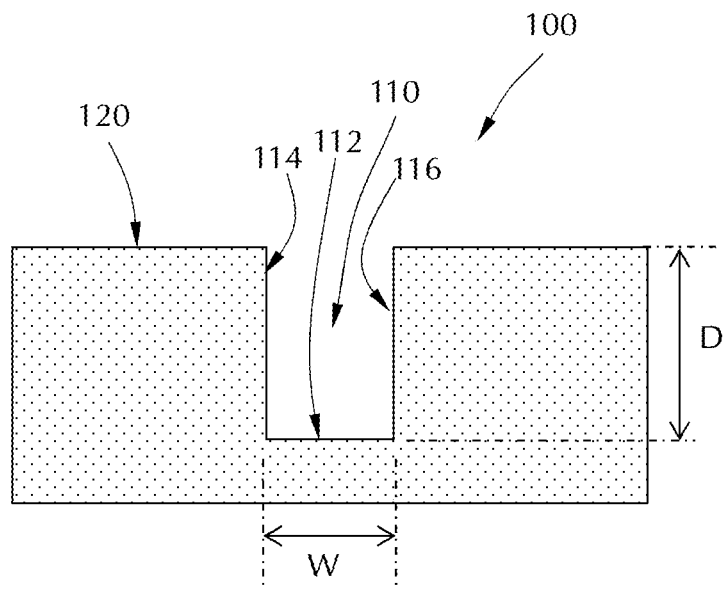
FIG. 1 shows a cross-sectional view of a substrate feature in accordance with one or more embodiment of the disclosure.
Figure 3A:
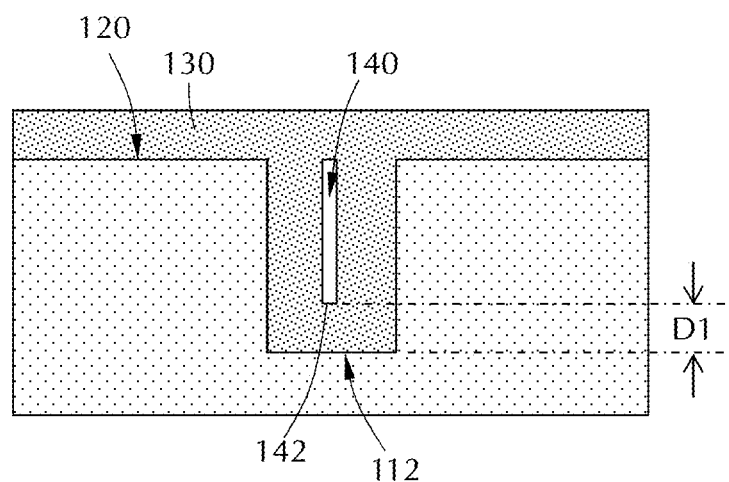
FIGS. 3A through 3E show a cross-sectional schematic of a gapfill process in accordance with one or more embodiment of the disclosure.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

Figure 2:
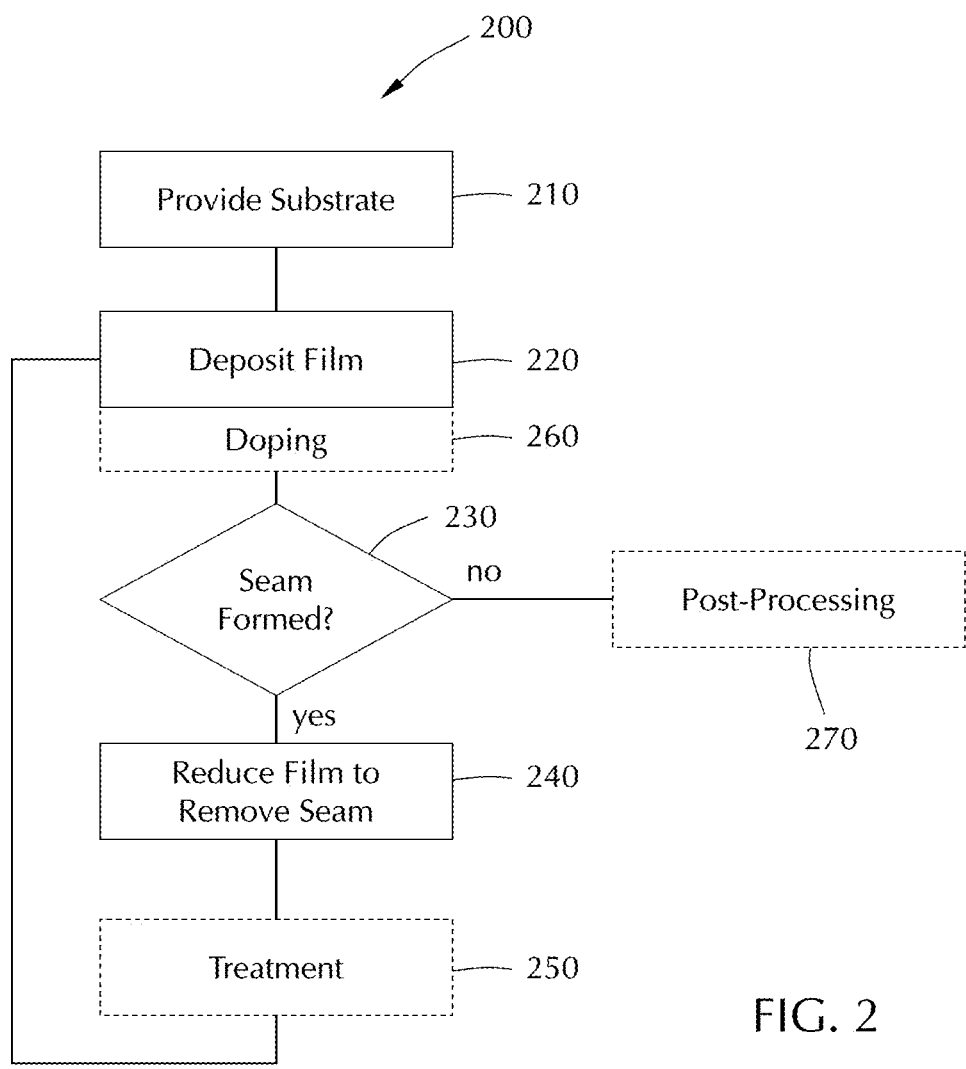
FIG. 2 shows a process flow in accordance with one or more embodiment of the disclosure.

FIG. 2 shows a processing method 200 in accordance with one or more embodiments of the disclosure. With reference to FIGS. 2 and 3A through 3E, the substrate 100 is provided for processing at 210. As used in this regard, the term "provided" means that the substrate is placed into a position or environment for further processing. At 220, a film 130 is formed on the substrate surface 120 and the walls and bottom of the feature 110.

The film formed can be any suitable film. In some embodiments, the film formed is an amorphous silicon film. The film can be formed by an suitable process including, but not limited to, chemical vapor deposition, plasma-enhanced chemical vapor deposition, atomic layer deposition and plasma-enhanced atomic layer deposition. Suitable silicon precursors include, but are not limited to, silane, disilane, dichlorosilane (DCS), trisilane, tetrasilane, etc. The precursor may be heated in a hot can to increase the vapor pressure and be delivered to the chamber using a carrier gas (e.g., ultrahigh purity (UHP) Ar, He, $H_2$, etc.).

In some embodiments, the film 130 forms conformally on at least one feature. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the film 130 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

A seam 140 is formed within the width W of the feature 110. The seam is illustrated as a rectangular opening in the film 130; however, those skilled in the art will understand that this is merely for illustrative purposes. The shape and size of the seam 140 can vary. The seam 140 has a bottom edge 142 that is a first distance D1 from the bottom surface 112 of the feature 110.

Figure 3C:
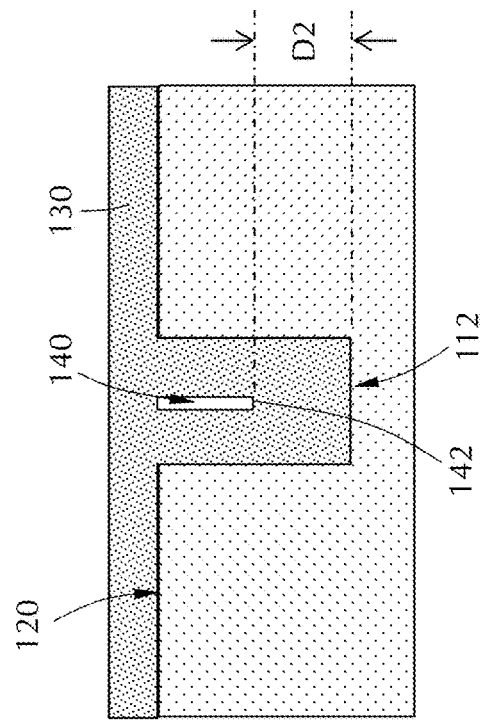
Figure 3E:
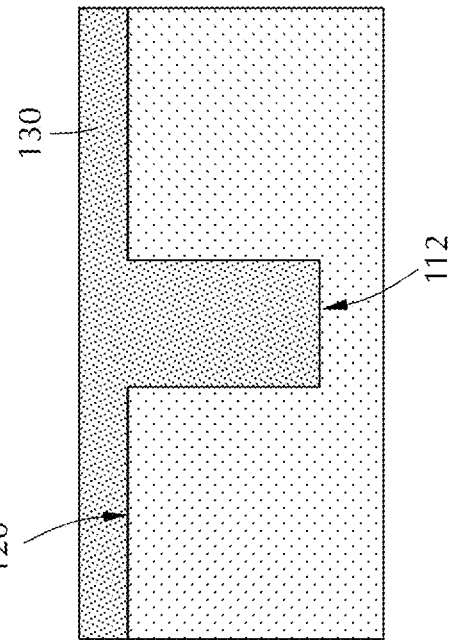
Figure 3B:
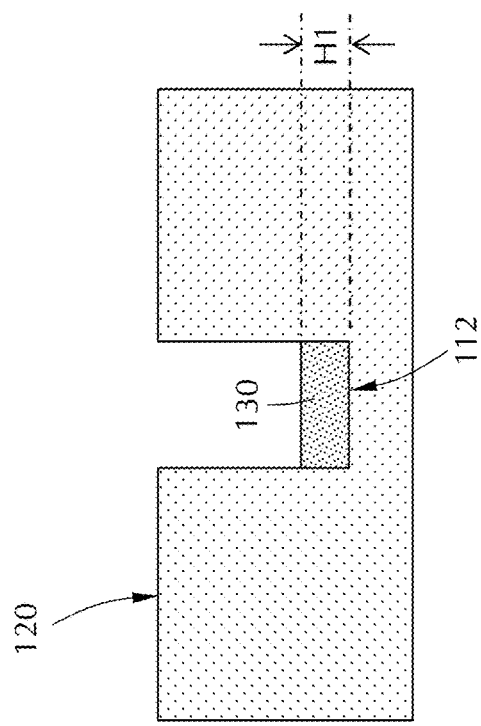

As a seam 140 has been formed, decision 230 directs the process to the next phase. Film reduction 240, the height or thickness of the film 130 is reduced to an amount smaller than the first distance D1. This is shown in FIG. 3B where it can be seen that the film 130 is removed from the substrate surface 120 and the first sidewall 114 and the second sidewall 116, leaving the film 130 at the bottom surface 112 of the feature 110. The seam 140 is no longer present because the height H1 of the film 130 remaining in the feature 110 is less than the first distance D1 of the bottom edge 142 of the seam 140.

The process of forming the film 130 on the substrate can be repeated at 220. As shown in FIG. 3C, the film 130 formed is thicker at the bottom of the feature 110 that at the substrate surface 120. The thickness at the bottom of the feature 110 is greater than the thickness at the substrate surface by an amount equal to about the height H1 of the film remaining in FIG. 3B.

As shown in FIG. 3C, a seam 140 is again formed in the film 130. The size of the seam 140 may be the same as or different from the seam formed in the previous film deposition. The bottom edge 142 of the seam 140 is now a distance D2 from the bottom surface 112 of the feature 110. The distance D2 is greater than the distance D1 so that the bottom edge 142 of the feature has moved in the direction of the substrate surface 120.

Figure 3D:
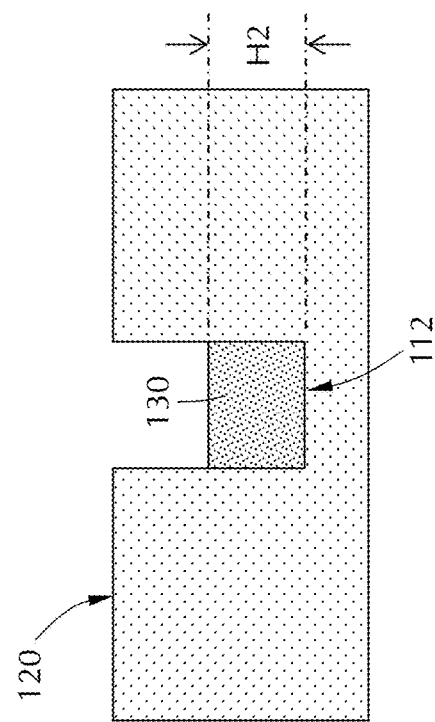

As a seam 140 has formed in the film 130, decision 230 is followed to reduce the thickness of the film 130 in another iteration of film reduction 240. This is shown in FIG. 3D in which the height or thickness of the film 130 is reduced to an amount less than or equal to the second distance D2 to remove the seam 140. The height H2 of the film remaining in the feature 110 is greater than the height H1 of the film remaining in the feature 110 after the first reduction 240.

The deposition 220 and reduction 240 phases can be repeated sequentially to gradually move the bottom edge of the seam a distance further from the bottom surface 112 of the feature 110. Each time deposition 220 is performed in which a seam 140 is formed, the bottom edge 142 of the seam 140 is further from the bottom surface 112 of the feature 110 than was the previous seam 140. As used in this specification and the appended claims, the "previous seam" means the seam that was formed prior to the most recent reduction 240. As used in this specification and the appended claims, the term "subsequent seam" means the seam that is formed in a later deposition 220 process.

After a suitable number of sequences or cycles of deposition and reduction, the film 130 formed will have substantially no seam to completely fill the gap of the feature 110. This is shown in FIG. 3E. As used in this specification and the appended claims, the term "substantially no seam", and the like, means that seam takes up less than about 1% of the volume of the feature 110. Since substantially no seam 140 is present, decision 230 would direct the process out of the deposition/reduction loop to one or more optional post-process 270.

Figure 4:
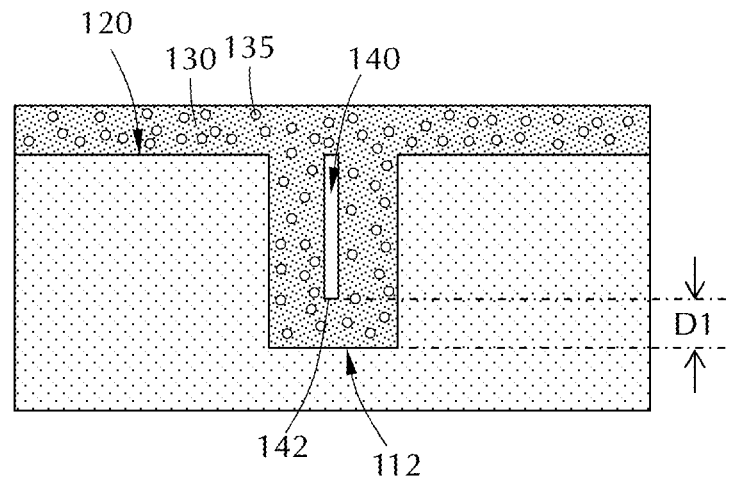
FIG. 4 shows a cross-sectional schematic of a doped gapfill film in accordance with one or more embodiment of the disclosure.

In some embodiments, the method 200 further comprises doping 260 the film 130 with a dopant 135. FIG. 4 shows an embodiment in which the film 130 has dopant 135 atoms incorporated therein. The dopant 135 can be incorporated into the film 130 at the same time as the formation of the film 130 or in a separate process sequentially with the film deposition. For example, depositing 220 the film 130 may occur followed by doping 260 the film 130 with the dopant 135 in a separate process in either the same process chamber or a different process chamber. In some embodiments, the deposition 220 of the film 130 occurs with the doping 260 in a single process. For example, the film precursor and dopant can be coflowed into the processing chamber to form the film 130.

The dopant 135 can be incorporated into the film 130 in any suitable concentration. In some embodiments, the film comprises up to about 40% dopant on an atomic basis. In one or more embodiments, the film 130 comprises in the range of about 1 atomic % to about 45 atomic %, or in the range of about 5 atomic % to about 40 atomic %, or in the range of about 10 atomic % to about 35 atomic %, or in the range of about 15 atomic % to about 30 atomic %. In some embodiments, the dopant 135 comprises one or more of B, P, Ga, Sn, As, Ge, C, N, Sb and/or In. In some embodiments, the film 130 comprises amorphous silicon and the dopant 135 comprises one or more of B, P, Ga, Sn, As, Ge, C, N, Sb or In.

In some embodiments, the dopant 135 is added to the film 130 during the film deposition 220. Suitable dopant 135 sources or precursors include, but are not limited to, dimethylamine borane [$NH(CH_3)_2BH_3$] (DMAB), diborane, $GeH_4$, etc. In one or more embodiments, co-flowing the dopant allows for the formation of an aSi which uses a reduced treatment temperature of reconstructing.

The temperature during deposition 220 can be any suitable temperature depending on, for example, the precursor(s) being used. In some embodiments, the deposition temperature is in the range of about 150° C. to 550° C., or in the range of about 200° C. to about 500° C., or in the range of about 250° C. to about 450° C. The deposition 220 can occur with or without plasma. The plasma can be a conductively-coupled plasma (CCP) or inductively coupled plasma (ICP) and can be a direct plasma or a remote plasma. The processing chamber pressure during deposition 220 can be in the range of about 100 mTorr to 650 Torr, or in the range of about 200 mTorr to about 600 Torr, or in the range of about 500 mTorr to about 550 Torr, or in the range of about 1 Torr to about 400 Torr.

Film reduction 240 reduces the height of the film 130. In some embodiments, reducing the height of the film comprises etching the film. Suitable etching techniques include, but are not limited to, wet etching, reactive ion etching (RIE) and high density plasma (HDP) etching. In some embodiments, etching the film comprises exposing the film to an etch chemistry comprising one or more of $NF_3$, $Cl_2$, HBr, $C_4F_6$, $C_2F_4$, $H_2$, Ar, He or $N_2$.

Some embodiments include an optional treatment 250 process. The treatment 250 process treats the film 130 to improve some parameter of the film. In some embodiments, the treatment 250 process comprises annealing the film. In some embodiments, treatment 250 can be performed by in-situ anneal in the same process chamber used for deposition 220 and/or reduction 240. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of $H_2$, Ar, He, $N_2$, $NH_3$, $SiH_4$, etc. The pressure during the anneal can be in the range of about 100 mTorr to about 1 atm.

In one or more embodiments, a processing method comprising providing 210 a substrate by positioning a substrate surface in a processing chamber. The substrate surface 120 has at least one feature 110 thereon which extends a depth from the substrate surface 120 to a bottom surface 112. The feature 110 also has a first sidewall 114 and a second sidewall 116 which define the width of the feature 110. The feature 110 is filled by sequentially exposing the substrate surface 120 to a film deposition 220 process and a reduction 240 (or etch) process. The film deposition 220 process of some embodiments comprises forming a conformal film on the at least one feature 110 creating a seam 140 within the width W of the feature 110. The seam 140 has a bottom edge 142 located a first distance D1 from the bottom surface 112 of the feature 110. The etch process decreases a height of the conformal film to an amount less than the first distance D1 to remove the seam 140. Each successive film deposition 220 forms a seam 140 within the width W of the feature 110 and each successive seam 140 has a bottom edge 142 a distance from the bottom surface 112 that is greater than the distance of the previous seam.

Some embodiments are directed to gapfill methods. A substrate having the described feature is filled with an amorphous silicon film by a gapfill process. The gapfill process comprises sequentially depositing 220 an amorphous silicon film with a seam, etching the amorphous silicon film to remove or reduce 240 the film and remove the seam and treatment 250 (e.g., annealing) of the amorphous silicon film. Each deposition 220 of the amorphous film forms the seam that is spaced a greater distance from the bottom surface of the feature than a previous deposition. The gapfill process is repeated until an amorphous silicon film is deposited without a seam.

Seam and void free gapfill of high aspect ratio trenches by CVD and ALD is becoming more challenging as the trench dimensions are getting narrower in each device node. Filling the trenches using conformal films deposited by CVD and ALD often leads to seam/void formation at the middle of the structure. Having a seam is not acceptable as it degrades device performance and yield. Some embodiments of the disclosure incorporate a post-deposition treatment to heal the seam.

Figures 5A, 5B:
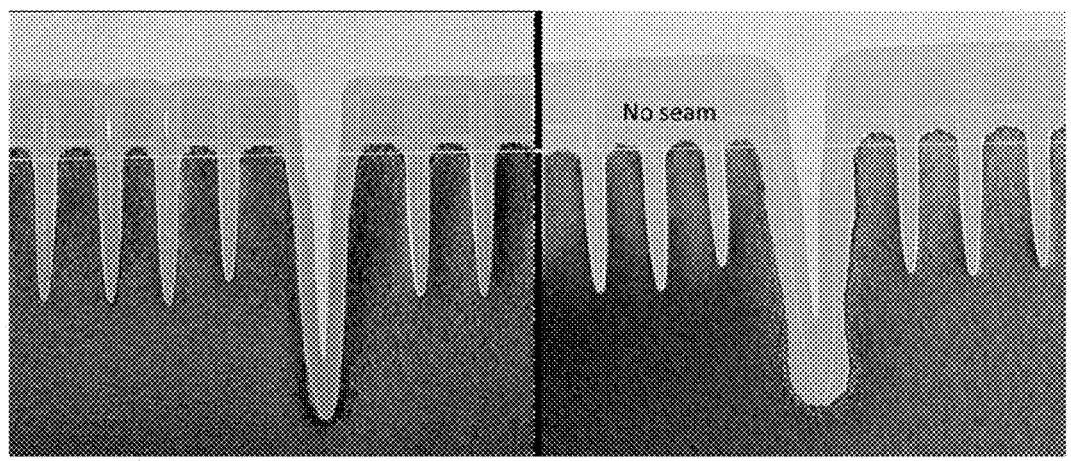
FIGS. 5A and 5B show TEM images of a trench before and after implantation in accordance with one or more embodiment of the disclosure.

Conventional seam healing uses rapid thermal heating to change the film morphology. However, the temperature used for such processes are often above 700° C.; which is higher than the acceptable thermal budget for most memory and logic devices. Some embodiments of the disclosure advantageously provide low temperature (e.g., <400° C.) seam healing processes with ion-implantation. FIG. 5A shows a seam at the top of the trenches. FIG. 5B shows the seams healed by cold argon implantation at a dose of 2.4e16 in accordance with one or more embodiments of the disclosure. In some embodiments, the methods can be applied to obtain seam free gapfill for various kinds of dielectrics (SiO, SiN, Si, SiC, etc.), metal oxides (AlO, MgO, TiO, ZrO, HfO, etc.) and metals (Al, W, TiN, TaN, etc.). Some embodiments advantageously provide control over the dose and/or dopant profile to heal seams of different trench depths.

In some embodiments, the substrate surface has a film with a seam between the sidewalls of the at least one feature. As used in this regard, the term "between" means that there is some film on either side of the seam between the seam and the sidewall of the feature. The seam is not limited to being exactly in the center of the sidewalls.

Ions are implanted into the film to heal the seams. Without being bound by any particular theory of operation, it is believed that implanting ions into the film breaks bonds in the film and allows the film to reflow and close the seams. Reflowing the film allows for the healing of the film without causing crystallization of the film.

Suitable ions include, but are not limited to ions of inert gases or dopants. In some embodiments, the implanted ions are argon atoms. In some embodiments, the implanted ions are dopant elements. The ions can have any charge (e.g., single, double, triple charged).

The temperature for ion implantation is sufficient to allow the film to remain substantially amorphous. As used in this regard, the term "substantially amorphous" means that there is less than about 10% or 5% crystallization of the film by area. In some embodiments, ion implantation occurs at a temperature less than about 500° C., 400° C., 300° C., 200° C., 100° C. or 50° C. In some embodiments, ion implantation occurs at about room temperature (25° C.).

The depth of the ion implantation can have an effect on the reflowing of the film. In some embodiments, ions are implanted into the film to a depth in the range of about 10 nm to about 150 nm. In some embodiments, the ions are implanted to a depth greater than about 10 nm, 20 nm, 30 nm, 40 nm, 50 nm, 60 nm, 70 nm, 80 nm, 90 nm, 100 nm, 110 nm, 120 nm, 130 nm, 140 nm or 150 nm, or higher.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
implanting ions into a film on a substrate surface, the substrate surface having at least one feature thereon, the at least one feature extending a depth from the substrate surface to a bottom surface, the at least one feature having a first sidewall and a second sidewall defining a width, the substrate surface including the film on at least one of the at least one feature, the film having a seam between the first sidewall and the second sidewall, the film comprising a metal oxide or a metal, wherein implanting ions into the film breaks bonds in the film and allows the film to reflow and close the seam.

2. The method of claim 1, wherein the ions are of an inert gas or dopant.

3. The method of claim 2, wherein the ions comprise argon.

4. The method of claim 2, wherein the ions comprise one or more of B, P, Ga, Sn, As, Ge, C, N, Sb or In.

5. The method of claim 1, wherein implanting ions occurs at a temperature less than about 500° C.

6. The method of claim 5, wherein implanting ions occurs at about room temperature.

7. The method of claim 1, wherein ions are implanted into the film to a depth in a range of about 10 nm to about 150 nm.

8. The method of claim 1, wherein the film comprises the metal oxide.

9. The method of claim 8, wherein the metal oxide comprises one or more of AlO, MgO, TiO, ZrO, or HfO.

10. The method of claim 1, wherein the film comprises the metal.

11. The method of claim 10, wherein the metal comprises one or more of Al, or W.

12. A processing method comprising:
implanting ions into a metal oxide film on a substrate surface, the substrate surface having at least one feature thereon, the at least one feature extending a depth from the substrate surface to a bottom surface, the at least one feature having a first sidewall and a second sidewall defining a width, the substrate surface including a film on at least one of the at least one feature, the metal oxide film having a seam between the first sidewall and the second sidewall,
wherein implanting ions into the metal oxide film occurs at a temperature less than about 500° C. and breaks bonds in the metal oxide film to allow the metal oxide film to reflow and close the seam.

13. The method of claim 12, wherein the metal oxide film comprises one or more of AlO, MgO, TiO, ZrO, or HfO.

14. A processing method comprising:
implanting ions into a metal film on a substrate surface, the substrate surface having at least one feature thereon, the at least one feature extending a depth from the substrate surface to a bottom surface, the at least one feature having a first sidewall and a second sidewall defining a width, the substrate surface including the film on at least one of the at least one feature, the metal film having a seam between the first sidewall and the second sidewall,
wherein implanting ions into the metal film occurs at a temperature less than about 500° C. and breaks bonds in the metal film to allow the metal film to reflow and close the seam.

15. The method of claim 14, wherein the metal film comprises one or more of Al, or W.

* * * * *